(12) United States Patent
Pearson et al.

(10) Patent No.: US 7,251,880 B2
(45) Date of Patent: Aug. 7, 2007

(54) METHOD AND STRUCTURE FOR IDENTIFYING LEAD-FREE SOLDER

(75) Inventors: Tom E. Pearson, Beaverton, OR (US); George Arrigotti, Portland, OR (US); Christopher D. Combs, Portland, OR (US); Raiyomand F. Aspandiar, Portland, OR (US)

(73) Assignee: Intel Corporation, Santa Clara, CA (US)

(*) Notice: Subject to any disclaimer, the term of this patent is extended or adjusted under 35 U.S.C. 154(b) by 403 days.

(21) Appl. No.: 09/964,746

(22) Filed: Sep. 28, 2001

(65) Prior Publication Data

US 2003/0062192 A1   Apr. 3, 2003

(51) Int. Cl.
*H01R 43/00* (2006.01)

(52) U.S. Cl. .............. 29/825; 29/840; 228/180.1; 228/180.21; 228/180.22; 438/612; 438/613

(58) Field of Classification Search ............ 29/832, 29/840; 228/180.1, 180.21, 180.22; 438/612, 438/613, 812, 813
See application file for complete search history.

(56) References Cited

U.S. PATENT DOCUMENTS 6,123,248 A * 9/2000 Tadauchi et al.
6,296,722 B1 * 10/2001 Nishimura
7,074,627 B2 * 7/2006 Burnette et al. .............. 438/14

FOREIGN PATENT DOCUMENTS

JP   01-004395   * 1/1989

OTHER PUBLICATIONS

Pb-Free External Lead Finishes for Electronic Components: Tin-Bismuth & Tin Silver By Ron Schetty 1998 IEMT Proceedings p. 380-385.*
Interfacial Reactions Between Lead-Free SnAgCu Solder and Ni(P) Surface Finish on Printed Circuit Boards by Zeng et al. IEE Trans on Electronics Packaging Manufacturing, vol. 25, No. 3, Jul. 2002, p. 162-167.*
Interactions of Lead (pb) in Lead Free Solder (Sn/Ag/Cu) System by Chung et al, 2002 Electronic Components and Technolog Conference, p. 168-175.*

* cited by examiner

*Primary Examiner*—Carl J. Arbes
(74) *Attorney, Agent, or Firm*—Schwegman, Lundberg, Woessner & Kluth, P.A.

(57) ABSTRACT

A method and apparatus are provided for determining whether solder used during assembly of a printed circuit board is lead-free or not. This may include providing a pad on the printed circuit board and placing solder on the pad in a predetermined pattern. The solder may be heated so as to create reflow. The solder may later be examined to determine if the solder is lead-free.

29 Claims, 5 Drawing Sheets

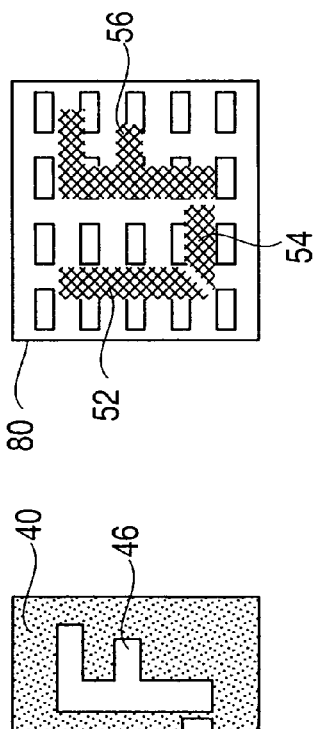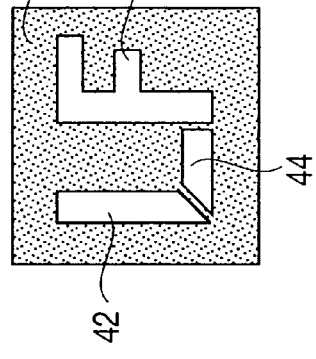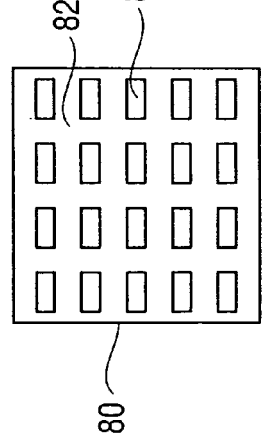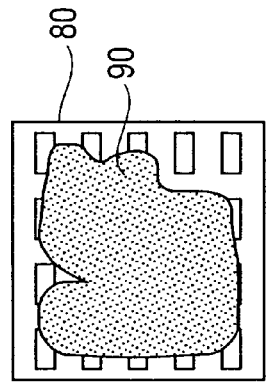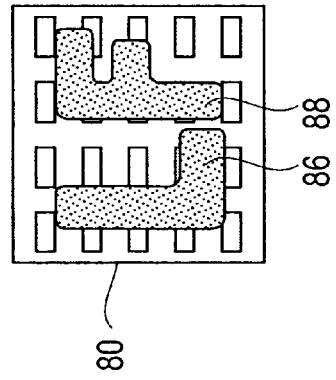

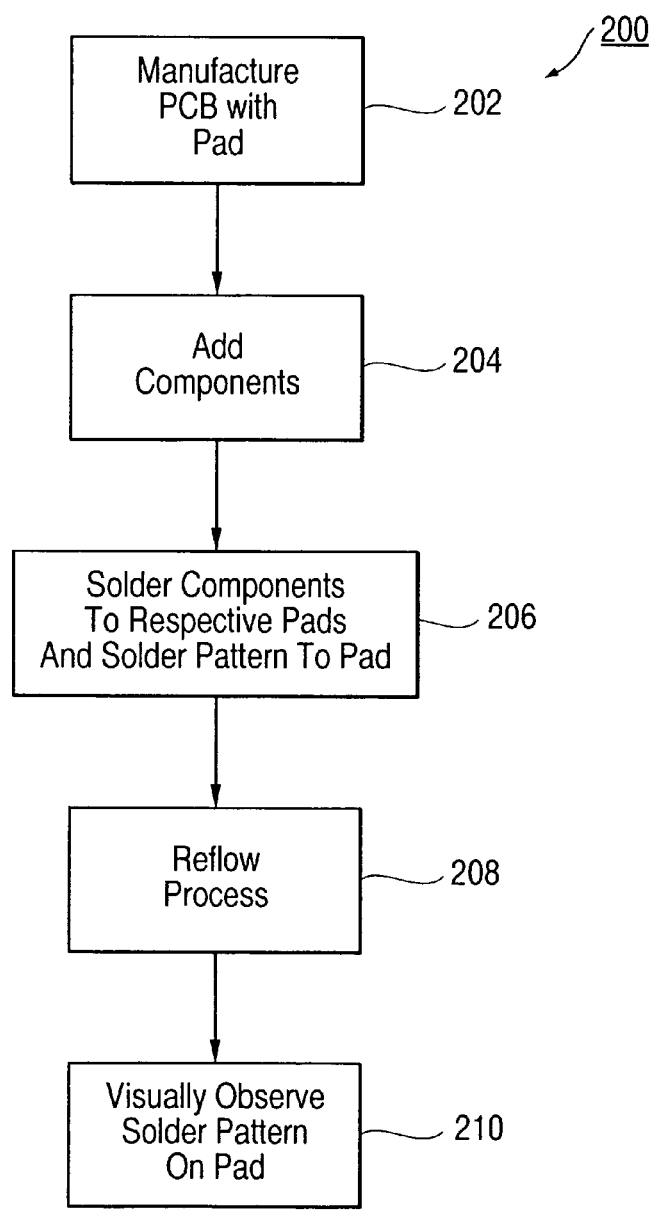

METHOD AND STRUCTURE FOR IDENTIFYING LEAD-FREE SOLDER

FIELD

The present invention is directed to the field of printed circuit boards. More particularly, the present invention is directed to a method and structure for distinguishing between lead-free solder and lead solder on a printed circuit board.

BACKGROUND

Electronic systems (e.g., computers, printers, etc.) may be designed with one or more printed circuit boards that are electrically connected together to perform various functions. One of these printed circuit boards, which is commonly employed within computers, is referred to as a "motherboard". The motherboard typically is the main printed circuit board that provides interconnections between primary electronic components of the computer such as its processor, memory and the like.

Manufacturers may follow a well-established circuit board assembly procedure in order to manufacture a fully functional circuit board. This circuit board assembly procedure may have four sequential stages of which the second, third and fourth stages are performed in an assembly line environment while the first stage is performed beforehand, normally at an off-line site, in an effort to speed up the assembly line stages. The first stage may involve programming various programmable electronic components using well-known manual or automated equipment operated by one or more persons. These programmable electronic components include, but are not limited to, read-only memory ("ROM"), erasable programmable read-only memory ("EPROM") and electrically erasable and re-programmable non-volatile memory (typically referred to as "flash" memory). Afterwards, electronic components may be connected to the circuit board during the second or third stages.

The second and third stages may involve assembly of the circuit board by connecting surface mount technology ("SMT") components followed by through hole mount technology ("THMT") components through various widely known techniques. For example, the technique for connecting SMT components to the circuit board may include the following operations: (i) solder paste application, (ii) proper placement of the SMT components, and (iii) reflow soldering to establish connections between bus lines previously routed in the circuit board and the SMT components. Likewise, the technique for connecting the THMT components may include the following operations: (i) proper placement of THMT components, and (ii) wave soldering.

The final stage in manufacturing circuit boards may involve testing each component (i.e., "in-circuit" testing) as well as the entire operation of the circuit board (i.e., "functional" testing) to determine whether the circuit board is functioning properly.

In the above-described assembly process, solder may be used to connect various components to the printed circuit boards. In the past, the solder contained tin and lead with lead comprising often as much as 37% of the total solder. However, lead based solder is undesirable due to environmental concerns. As such, environmentalists and manufacturers have started to use lead-free solder to connect components to the printed circuit boards. A circuit board that does not use lead based solder may be called a lead-free circuit board. These lead-free circuit boards may need to be distinguished from printed circuit boards having lead based solder at various times over the life cycle of the printed circuit board.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIGS. 4A-4E illustrates a technique of distinguishing between lead solder and lead-free solder according to an example embodiment of the invention;

FIG. 6 is a flowchart showing a method of distinguishing between lead solder and lead-free solder according to an example embodiment of the present invention.

DETAILED DESCRIPTION

Figure 1:
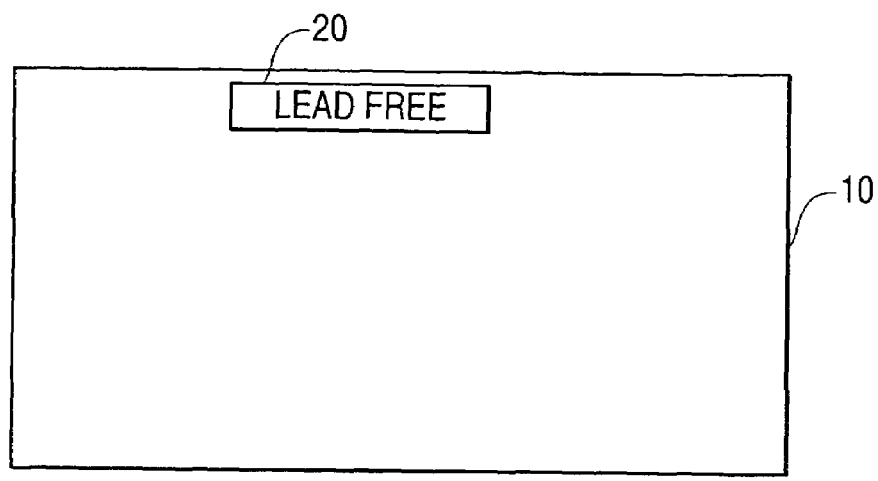
FIG. 1 illustrates an example of labeling a printed circuit board.

In the following detailed description, like reference numerals and characters may be used to designate identical, corresponding or similar components in differing figure drawings.

In the following discussions, embodiments and arrangements may discuss lead-free solder, lead solder, lead-free circuit boards and lead circuit boards. A lead-free circuit board relates to a circuit board that utilizes relatively lead-free solder. A lead circuit board relates to a circuit board that utilizes relatively lead based solder. The terminologies lead-free solder and lead solder is not intended to mean 100% non-lead solder or 100% lead solder, respectively. Rather, these terminologies are intended to mean that the solder is relatively lead-free or that the solder contains lead, respectively.

Lead-free solder or printed circuit boards (PCBs) that are lead-free need to be identified at different times over the life cycle of the printed circuit board. Future environmental laws may make it necessary for a board manufacturer to identify if a printed circuit assembly (PCA) has been assembled using lead-free technology. Lead-free solder on PCAs are not usually detected during or after assembly because lead-free solder looks visually the same color and texture as tin/lead solder (hereafter referred to as lead solder). Visual inspections thereafter may be incapable of detecting PCAs that utilize lead-free solder. Lead-free boards need to be identified after surface mount technology assembly during repair, at OEM during repair, at end customers during repair, and at end of life when the board is recycled or put into a landfill. Because the PCBs can be manufactured with lead solder or lead-free solder, it may not be very practical to simply write lead-free on the PCB. As one example, the PCB may be incorrectly labelled. PCBs need a fool proof witness mark that is visible to the end user to clearly indicate if a board was manufactured using lead solder or lead-free solder.

FIG. 1 illustrates an example of labeling a printed circuit board. In particular, FIG. 1 shows a printed circuit board 10 that includes a label 20 that may be printed by a silk screen or by using copper traces. The label may be added before or after the manufacturing process using the same labeling process as serial number labels are placed on PCBs. In this example, the label identifies the board as being lead-free (or containing lead-free solder). That is, FIG. 1 shows a method of distinguishing PCBs soldered with lead-free solder from those soldered with lead solder by physically labeling the board. However, this labeling process is not standardized in the industry and boards may be mis-labeled.

Embodiments of the present invention may provide a method for determining whether solder used during assembly of a printed circuit board is lead-free or not. This method may include providing a pad (such as a non-functional pad) on a substrate such as a PCB. The pad may be a flat copper area with a metallic or organic surface coat on top that is exposed on the top or bottom layer of the PCB. A predetermined pattern on a stencil may be screen printed onto a pad during the solder paste printing process that applies solder paste. The predetermined pattern on the stencil may create a corresponding predetermined solder pattern on the pad. The solder (and the PCB) may be heated in an oven to create a normal solder reflow process. The solder pattern on the pad may later be visually examined to determine whether the solder is lead-free based on the amount of reflow of the solder on the pad. That is, embodiments of the present invention may utilize properties (such as its wetability) of lead-free solder so as to distinguish between lead-free solder and lead solder.

Lead solder, which may contain 37% lead and 63% Tin, may form a contact angle of 5-7 degrees with respect to a pad. This compares with lead-free solder (containing tin, silver and copper or other materials) that may form a contact angle of 15-30 degrees with respect to a pad. The smaller the contact angle of the solder to the pad, the better the wetability of the PCB pad surface. The contact angle and wetability of the solder may be used to create a detectable land pad that displays a visual indicator for lead boards and displays a different visual indicator for lead-free boards.

Embodiments of the present invention may be designed into the PCB land patterns and solder stencil tools so that manual insertion or labeling is not needed to apply to the product. A land pattern (or pad) may be introduced into the PCB in the same manner as the other SMT land pads are designed. If the board is manufactured/assembled with lead based solder, then the land pads may display differently after reflow than the land pads having lead-free solder.

Figure 2:
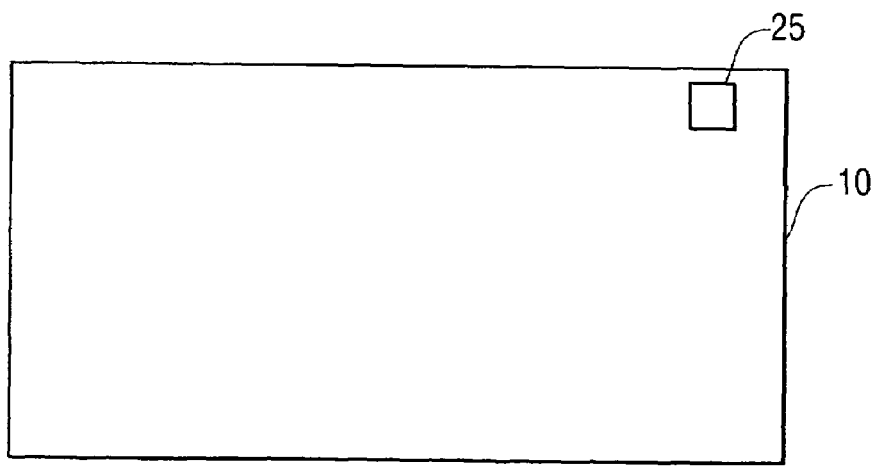
FIG. 2 illustrates an example of distinguishing types of solder on a printed circuit board according to an example embodiment of the present invention.

FIG. 2 illustrates an example of distinguishing types of solder on a printed circuit board according to an example embodiment of the present invention. Other embodiments and configurations are also within the scope of the present invention. More specifically, FIG. 2 shows a printed circuit board 10 having a pad 25 (or land) that will be used in accordance with embodiments of the present invention. The use of the pad 25 will become more apparent from the following description.

FIGS. 3A-3E illustrate a technique of distinguishing between lead solder and lead-free solder on a printed circuit board in accordance with an example embodiment of the present invention. Other embodiments and configurations are also within the scope of the present invention. Embodiments of the present invention are not limited to the use of a land pad on a printed circuit board as embodiments may also relate to other types of substrates.

Figure 3A:
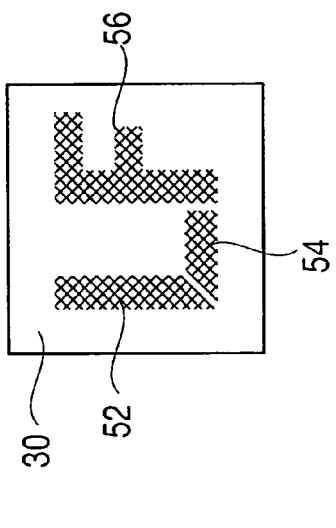
FIGS. 3A-3E illustrates a technique of distinguishing between lead solder and lead-free solder according to an example embodiment of the invention.

FIG. 3A illustrates a pad 30 (or land pad) that may be provided on a printed circuit board. The pad 30 may correspond to the pad 25 shown in FIG. 2. The land pad 30 may have a copper surface finish or a gold surface finish, for example. In one example embodiment, the pad 30 may be in the shape of a square having dimensions of 5 mm×5 mm. Other shapes and dimensions are also within the scope of the present invention.

Figure 3B:
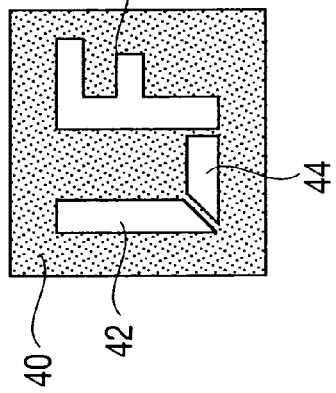

FIG. 3B shows a stencil section 40 that may be provided over the pad 30 when solder is applied to the printed circuit board. The stencil section 40 is only part of a larger stencil or stencil tool that will be used to apply solder over the PCB. The stencil section 40 may be of a size relative to the pad 30. The stencil section 40 includes three apertures for passing solder paste, namely a first aperture 42, a second aperture 44 and a third aperture 46. The first aperture 42 and the second aperture 44 correspond to the character symbol "L" whereas the third aperture 46 corresponds to the character symbol "F". Although the stencil section 40 shows three apertures, embodiments of the present invention are not limited to this number of apertures. The stencil apertures are the openings on the solder stencil that will allow the solder paste to flow through to the respective PCB land pads (including the pad 30). The apertures 42, 44 and 46 are used to create the character symbols "LF" representing lead-free solder, for example. Embodiments of the present invention are also applicable to other combinations of letters, characters or symbols to represent lead-free (or other designations). The letters, characters or symbols may be made using a stencil in the same fashion as SMT apertures for other land pad patterns.

Figure 3C:
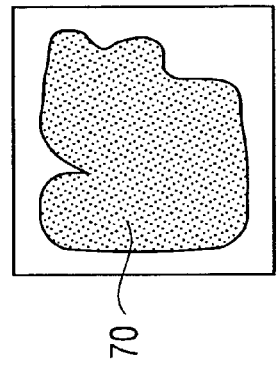

FIG. 3C shows solder paste 52 on an area of the pad 30 corresponding to the aperture 42, solder paste 54 on an area of the pad 30 corresponding to the aperture 44, and solder paste 56 on an area of the pad 30 corresponding to the aperture 46. That is, FIG. 3C shows the solder paste on the pad before reflow.

Figure 3D:
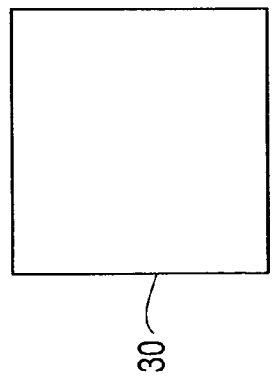
Figure 3E:
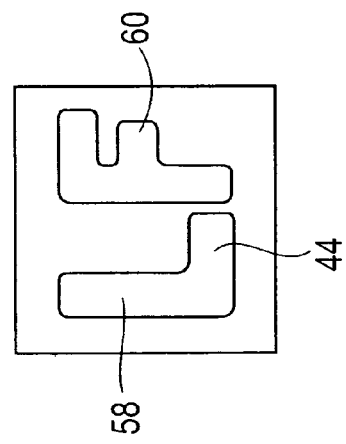

FIG. 3D and FIG. 3E both relate to the shape of the solder pattern on the pad 30 after reflow. More specifically, FIG. 3D shows a shape of the "LF" character symbols after reflow using lead-free solder. The symbol "L" is shown as solder mass 58 and the symbol "F" is shown as solder mass 60. Accordingly, when using lead-free solder one may visually recognize the symbols (representing lead-free solder) after reflow. FIG. 3E shows a shape of the "LF" pattern after reflow when using lead based solder. A solder mass 70 corresponds to the solder pattern "LF" after reflow. That is, the previous "LF" character symbols reflow into a glob-like shape.

A person may visually distinguish between the readable pattern shown in FIG. 3D and the pattern shown in FIG. 3E. A person may thereby distinguish whether lead-free solder was used during the manufacturing process (as shown in FIG. 3D) or whether lead based solder was used in the manufacturing process (as shown in FIG. 3E). Since lead-free solder has three times less wetability than lead based solder, the shape of the character symbols "LF" made using lead-free solder may be readable to anyone who visually inspects the board after reflow. On the other hand, since the wetability of tin/lead solder is three times more than lead-free solder, the character symbols "LF" made using lead solder may not be visually readable (as shown in FIG. 3E) to anyone who visually inspects the board after reflow. Thus, any person visually observing the pad 30 may distinguish between whether the PCB is a lead board or whether the PCB is a lead-free board based on whether they may visually see or read the "LF" character symbols.

FIGS. 4A-4E illustrate another technique of distinguishing between lead solder and lead-free solder on a printed circuit board according to another example embodiment of the present invention. Other embodiments and configurations are also within the scope of the present invention. More specifically, FIG. 4A illustrates a checkerboard pad 80 that may be provided on a printed circuit board. The pad 80 may correspond to the pad 25 shown in FIG. 2. The checkerboard pad 80 includes solderable areas 82 and non-solderable area 86 (where the solder mask is not etched away).

FIG. 4B shows the stencil section 40 that may be provided over the pad 80 when solder is applied to the printed circuit board. The stencil section 40 is only part of a larger stencil or stencil tool that will be used to apply solder over the PCB. The stencil section 40 may be of a size relative to the pad 80. FIG. 4B shows the stencil 40 includes the first aperture 42, the second aperture 44 and the third aperture 46 in a similar manner to the stencil 40 shown in FIG. 3B.

FIG. 4C shows the solder paste 52 on the pad 80 in an area corresponding to the aperture 42, the solder paste 54 on the pad 80 in an area corresponding to the aperture 44 and the solder paste 56 on the pad 80 in an area corresponding to the aperture 46. That is, FIG. 4C shows the solder paste on the pad before reflow.

FIG. 4D and FIG. 4E both relate to the shape of the solder pattern on the pad 80 after reflow. More specifically, FIG. 4D shows a shape of the "LF" character symbols after reflow using lead-free solder. The symbol "L" is shown as solder mass 86 and the symbol "F" is shown as solder mass 88. Accordingly, when using lead-free solder one may visually recognize the symbols (representing lead-free solder) after reflow. FIG. 4E shows a shape of the "LF" pattern after reflow when using lead based solder. A solder mass 90 corresponds to the solder pattern "LF" after reflow. That is, the previous "LF" character symbols reflow into a glob-like shape.

A person may visually distinguish between the readable pattern shown in FIG. 4D and the pattern shown in FIG. 4E. A person may thereby distinguish whether lead-free solder was used during the manufacturing process (as shown in FIG. 4D) or whether lead based solder was used in the manufacturing process (as shown in FIG. 4E). Since lead-free solder has three times less wetability than lead based solder, the shape of the character symbols "LF" made using lead-free solder may be readable to anyone who visually inspects the board after reflow. On the other hand, since the wetability of tin/lead solder is three times more than lead-free solder, the character symbols "LF" made using lead solder may not be visually readable (as shown in FIG. 4E) to anyone who visually inspects the board after reflow. Thus, any person visually observing the pad 80 may distinguish between whether the PCB is a lead board or whether the PCB is a lead-free board based on whether they may visually see or read the "LF" character symbols.

Figure 5A:
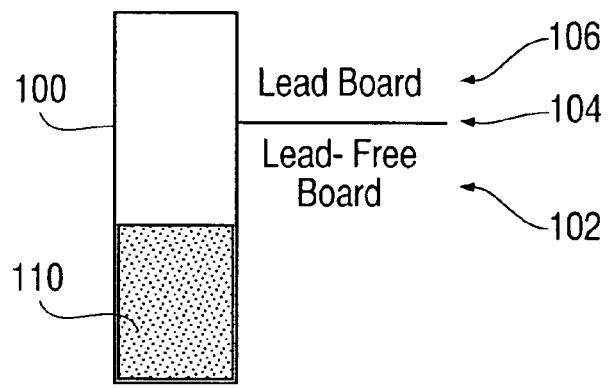
FIGS. 5A-5C illustrates a technique of distinguishing between lead solder and lead-free solder according to an example embodiment of the invention.
Figure 5B:
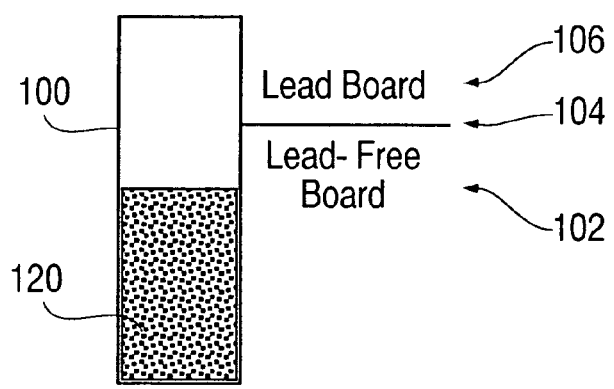
Figure 5C:
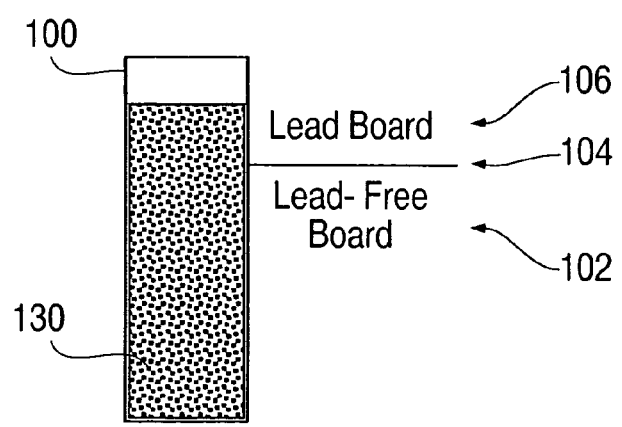

FIGS. 5A-5C illustrate another technique of distinguishing between lead solder and lead-free solder on a printed circuit board in accordance with another example embodiment of the present invention. Other embodiments and configurations are also within the scope of the present invention. More particularly, FIG. 5A shows a pad 100 in the shape of a rectangle, although embodiments of the present invention are not limited to a rectangular shape. In this embodiment, a stencil may apply solder paste 110 at one end of the pad 100. The solder paste 110 may be a uniform square pattern or relatively rectangular pattern, for example. The board 10 may include visual indicators 102, 104 and 106 provided along a side of the pad 100 to serve as visual indicators to any person who desires to know whether the board is lead-free or not. The visual indicators 102, 104 and 106 may be provided on the printed circuit board by a silk-screen printing process or by using other types of processes. For example, the visual indicators 102, 104 and 106 may be printed by the PCB supplier during their silk screen process. Visual indicators 102, 104 and 106 may be provided on the side of the pad 100 prior to the soldering process. In this example, the visual indicator 102 may correspond to the words "LEAD-FREE BOARD", the visual indicator 104 may be a line or arrow at a certain location along the pad 100, and the visual indicator 106 may correspond to the words "LEAD BOARD". The visual indicators 102, 104 and 106 may be utilized by a person to distinguish whether the board is lead-free or not based on an amount of solder reflow along the pad 100.

As shown in FIG. 5B, the solder paste 110 becomes solder mass 120 after reflow when using lead-free solder. In this example, the solder mass 120 reflows along the pad 100 to an area adjacent the visual indicator 102. The visual indicator 102 indicates that the solder mass 120 corresponds to lead-free solder. If the solder reflows past the visual indicator 104 to an area adjacent the visual indicator 106, then the solder may be considered lead solder. As shown in FIG. 5C, the solder paste 110 becomes the solder mass 130 after reflow when using lead based solder. That is, the solder mass 120 extends along the pad 100 to an area adjacent the visual indicator 106. Thus, a person may identify the solder mass 130 as corresponding to lead solder based on the visual indicator 106.

Accordingly, FIGS. 5A-5C show the use of a lead-free indicator strip. This apparatus may be used to determine whether the PCA was assembled using lead solder or whether it was assembled using lead-free solder. As discussed above, a visual indicator may be provided next to the solder paste and the PCB land pad and may be printed onto the PCB by a PCB silk-screen process. The visual indicator may visually show how far the solder must flow and wet before it can be considered a lead board or a lead-free board. FIG. 5B shows the indicator strip after reflow of the lead-free solder paste. Thus, using the lower wetability properties of lead-free solder, one may detect that the board is lead free based on the amount of area on the pad that the solder wets. FIG. 5C shows the indicator strip after reflow of the lead solder paste. This indicator clearly shows that the board is a lead soldered board.

FIG. 6 is a flowchart 200 showing a method of distinguishing between lead solder and lead-free solder according to an example embodiment of the present invention. Other operations and orders of operations are also within the scope of the present invention. More specifically, the PCB is manufactured with a pad (such as the pad 25 from FIG. 2) in block 202. In block 204, the respective SMT components (or other components) may be added to the PCB in a normal manner. In block 206, the components may be soldered to their respective pads and the predetermined solder pattern (that will be used to be visually distinguishing between lead-free solder and lead solder) may be placed onto its respective pad. In block 208, the printed circuit board (including the solder on the pad) may undergo reflow in a normal manner. As is well known in the art, this may involve heating the printed circuit board such that the solder paste turns to a liquid state. The solder may be cooled down such that the respective solder connections are electrically and mechanically connected to the respective components. In block 210, a person may visually observe the solder pattern on the pad so as to distinguish between lead-free solder and lead solder. As one example, this may correspond to distinguishing the character symbols "LF" from a glob-like solder mass after reflow. Other symbols, characters, and shapes may also be used with embodiments of the present invention so as to visually distinguish between lead-free solder and lead solder.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
   placing a predetermined solder pattern in a shape of a symbol onto a pad provided on a substrate;
   heating said predetermined solder pattern and turning the solder pattern to a liquid state; and
   cooling the predetermined solder pattern, turning the heated and cooled predetermined solder pattern to a solid state;
   wherein a visual appearance of said heated and cooled predetermined solder pattern is indicative of whether a solder paste used to form the predetermined solder pattern is lead-free by maintaining a substantially same pattern as the symbol of said predetermined solder pattern after heating and cooling the predetermined solder pattern when the solder paste used to form the predetermined solder pattern is lead-free.

2. The method of claim 1, wherein said substrate comprises a printed circuit board.

3. The method of claim 1, wherein placing said predetermined solder pattern comprises passing the solder paste used to form the shape of the symbol through at least one stencil aperture and onto said pad.

4. The method of claim 1, wherein said predetermined solder pattern comprises at least one symbol including the letters "LE" representing lead-free solder.

5. The method of claim 1, further comprising examining said heated cooled predetermined solder pattern to determine if said solder is lead-free.

6. The method of claim 5, wherein examining said heated and cooled predetermined solder pattern comprises visually identifying whether said predetermined solder pattern after heating and cooling is in substantially a same pattern as said predetermined solder pattern before heating and cooling.

7. The method of claim 5, wherein examining said heated and cooled predetermined solder pattern comprises determining that said solder is lead-free if said predetermined solder pattern after heating is in substantially a same pattern as said predetermined solder pattern before heating.

8. A method comprising:
   providing a pad on a substrate;
   placing solder on said pad; and
   heating said solder so as to create reflow; and
   cooling said solder after the reflow is completed;
   wherein a visual appearance of said heated and cooled solder is indicative of whether said solder is lead-free based on the amount of reflow of said solder on said pad.

9. The method of claim 8, wherein said substrate comprises a printed circuit board.

10. The method of claim 8, wherein placing said solder on said pad comprises passing said solder through at least one stencil aperture and onto said pad.

11. The method of claim 10, wherein said solder is placed onto said pad in a predetermined pattern.

12. The method of claim 11, further comprising determining that said solder is lead-free if said predetermined solder pattern after heating and cooling is in substantially a same pattern as said predetermined solder pattern before heating.

13. The method of claim 11, wherein said predetermined pattern comprises at least one symbol.

14. The method of claim 8, further comprising identifying whether said solder is lead-free based on an amount of reflow of said heated and cooled solder.

15. The method of claim 14, wherein identifying whether said solder is lead-free comprises visually identifying whether said solder after reflow is in substantially the same predetermined pattern as before reflow.

16. The method of claim 14, wherein identifying said solder as lead-free comprises determining whether an amount of reflow is greater than a predetermined amount.

17. The method of claim 16, wherein said determining is based on a distance of reflow along said pad.

18. The method of claim 9, wherein placing said solder on said pad comprises placing solder at one end of an indicator strip.

19. A method of identifying whether a printed circuit board is lead-free, said method comprising:
   receiving said printed circuit board having a heated solder pattern formed thereon; and
   identifying whether solder on said printed circuit board is lead-free based on whether said heated and cooled solder pattern is substantially similar to a predetermined solder pattern.

20. The method of claim 19, wherein said predetermined solder pan em comprises at least one of a symbol and a character.

21. The method of claim 19, wherein said solder on said printed circuit board is determined to be lead-free if said heated and cooled solder pattern is substantially similar to said predetermined solder pattern.

22. The method of claim 19, wherein said solder on said printed circuit board is determined to not be lead-free if said heated and cooled solder pattern substantially differs from said predetermined solder pattern.

23. A method of identifying whether a printed circuit board is lead-free, said method comprising:
receiving said printed circuit board having a heated and then cooled solder pattern formed on a pad thereon; and
identifying whether solder on said printed circuit board is lead-free based on a distance that said solder pattern reflows by comparing the distance that said solder pattern reflows with at least one visual indicator provided at a certain location along the pad on said printed circuit board.

24. The method of claim 23, wherein said identifying comprising comparing a distance that said solder reflows with at least one indicator line provided on said printed circuit board.

25. The method of claim 24, wherein said solder on said printed circuit board is determined to be lead-free if said solder has not reflowed further than said at least one visual indicator including a line.

26. The method of claim 24, wherein said solder on said printed circuit board is determined to not be lead-free if said solder has reflowed further than said at least one visual indicator.

27. A method comprising:
placing a solder paste in a predetermined solder pattern onto a pad on a substrate having a first visual indicator along side the pad including the words "LEAD-FREE BOARD" and a second visual indicator along side the pad including the words "LEAD BOARD" and a third visual indicator along side the pad and between the first visual indicator and the second visual indicator;
heating and cooling said predetermined solder pattern; and
determining that said solder is lead-free if said predetermined solder pattern after heating and cooling reflows a distance along the pad that does not extend to an area adjacent to the second visual indicator.

28. The method of claim 27, wherein said predetermined solder pattern comprises a rectangle.

29. The method of claim 27, wherein said substrate comprises a printed circuit board.

* * * * *

UNITED STATES PATENT AND TRADEMARK OFFICE
CERTIFICATE OF CORRECTION

PATENT NO. : 7,251,880 B2  Page 1 of 1
APPLICATION NO. : 09/964746
DATED : August 7, 2007
INVENTOR(S) : Pearson et al.

It is certified that error appears in the above-identified patent and that said Letters Patent is hereby corrected as shown below:

On the title page, item (56), under "Other Publications", in column 2, lines 1-2, delete "Tiin-Bismuth" and insert -- Tin-Bismuth --, therefor.

On the title page, item (56), under "Other Publications", in column 2, line 9, delete "Technolog" and insert -- Technology --, therefor.

In column 8, line 3, in Claim 4, delete ""LE"" and insert -- "LF" --, therefor.

In column 8, line 5, in Claim 5, after "heated" insert -- and --.

In column 8, line 64, in Claim 20, delete "pan em" and insert -- pattern --, therefor.

Signed and Sealed this

Twenty-seventh Day of May, 2008

JON W. DUDAS
*Director of the United States Patent and Trademark Office*